(12) United States Patent
Chang et al.

(10) Patent No.: US 9,887,095 B2
(45) Date of Patent: Feb. 6, 2018

(54) SYSTEM AND METHOD FOR AN ETCH PROCESS WITH SILICON CONCENTRATION CONTROL

(71) Applicant: Taiwan Semiconductor Manufacturing Company, Ltd., Hsin-Chu (TW)

(72) Inventors: Fu Yi Chang, Taipei County (TW); Yih-Song Chiu, Hsin-chu (TW); Shao-Yen Ku, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 105 days.

(21) Appl. No.: 14/205,665

(22) Filed: Mar. 12, 2014

(65) Prior Publication Data
US 2014/0273303 A1 Sep. 18, 2014

Related U.S. Application Data

(60) Provisional application No. 61/777,928, filed on Mar. 12, 2013.

(51) Int. Cl.
| | |
|---|---|
| *H01L 21/66* | (2006.01) |
| *H01L 21/311* | (2006.01) |
| *H01L 21/67* | (2006.01) |
| *H01L 21/762* | (2006.01) |

(52) U.S. Cl.
CPC .. *H01L 21/31111* (2013.01); *H01L 21/67253* (2013.01); *H01L 21/76224* (2013.01); *H01L 22/10* (2013.01); *H01L 22/12* (2013.01); *H01L 22/20* (2013.01)

(58) Field of Classification Search
CPC ......... H01L 21/67086; H01L 21/31111; H01L 21/67253; H01L 21/30604; H01L 22/12; H01L 22/20; H01L 22/10; H01L 21/7624
See application file for complete search history.

(56) References Cited

U.S. PATENT DOCUMENTS

| | | | |
|---|---|---|---|
| 6,780,277 B2 * | 8/2004 | Yokomizo | ......... H01L 21/67086 156/345.11 |
| 7,238,295 B2 * | 7/2007 | Izuta | ........................ C23F 1/46 216/83 |

(Continued)

FOREIGN PATENT DOCUMENTS

| | | |
|---|---|---|
| TW | 200304185 | 9/2009 |
| TW | 200943459 | 10/2009 |

(Continued)

OTHER PUBLICATIONS

Office Action dated Feb. 24, 2016, issued by the Taiwan Patent Office in connection to Patent Application No. 103115214, 4 pages.

*Primary Examiner* — Michael Trinh
(74) *Attorney, Agent, or Firm* — Haynes and Boone, LLP

(57) ABSTRACT

The present disclosure provides one embodiment of an etch system. The etch system includes a tank designed to hold an etch solution for etching; a silicon monitor configured to measure silicon concentration of the etch solution; a drain module coupled to the tank and being operable to drain the etch solution; and a supply module being operable to fill in the tank with a fresh etch solution.

17 Claims, 13 Drawing Sheets

(56) References Cited

U.S. PATENT DOCUMENTS

| | | | | |
|---|---|---|---|---|
| 7,713,478 B2* | 5/2010 | Watatsu | ............... | H01L 22/14 216/99 |
| 8,158,075 B2* | 4/2012 | Watanabe | ............ | B01D 9/0027 210/348 |
| 2009/0080879 A1* | 3/2009 | Osawa | ................ | G03D 3/02 396/626 |
| 2013/0122716 A1* | 5/2013 | Reimer | ............ | H01L 21/67086 438/749 |

FOREIGN PATENT DOCUMENTS

| TW | 201005822 | 2/2010 |
|---|---|---|
| TW | 201308422 | 2/2013 |

\* cited by examiner

SYSTEM AND METHOD FOR AN ETCH PROCESS WITH SILICON CONCENTRATION CONTROL

This application claims priority to U.S. Provisional Patent Application Ser. No. 61/777,928, filed on Mar. 12, 2013, the entire disclosure of which is hereby incorporated herein by reference.

BACKGROUND

The integrated circuits scale down along with the advanced technology nodes. The scaling of integrated circuit faces various challenges that include patterning and other fabrication process. For example, shallow trench isolation (STI) features are formed in a silicon substrate to define various active regions for various devices, such as field effect transistors (FETs). However, the formation of the STI features by the existing methods has various concerns. In one example, the step height cannot be properly controlled to achieve expected device performance. In another example, the step height cannot be consistently controlled from wafer to wafer. In another example, various particles are introduced to the semiconductor substrate during the formation of the STI features.

Accordingly, there is a need for a method and a system to address these concerns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
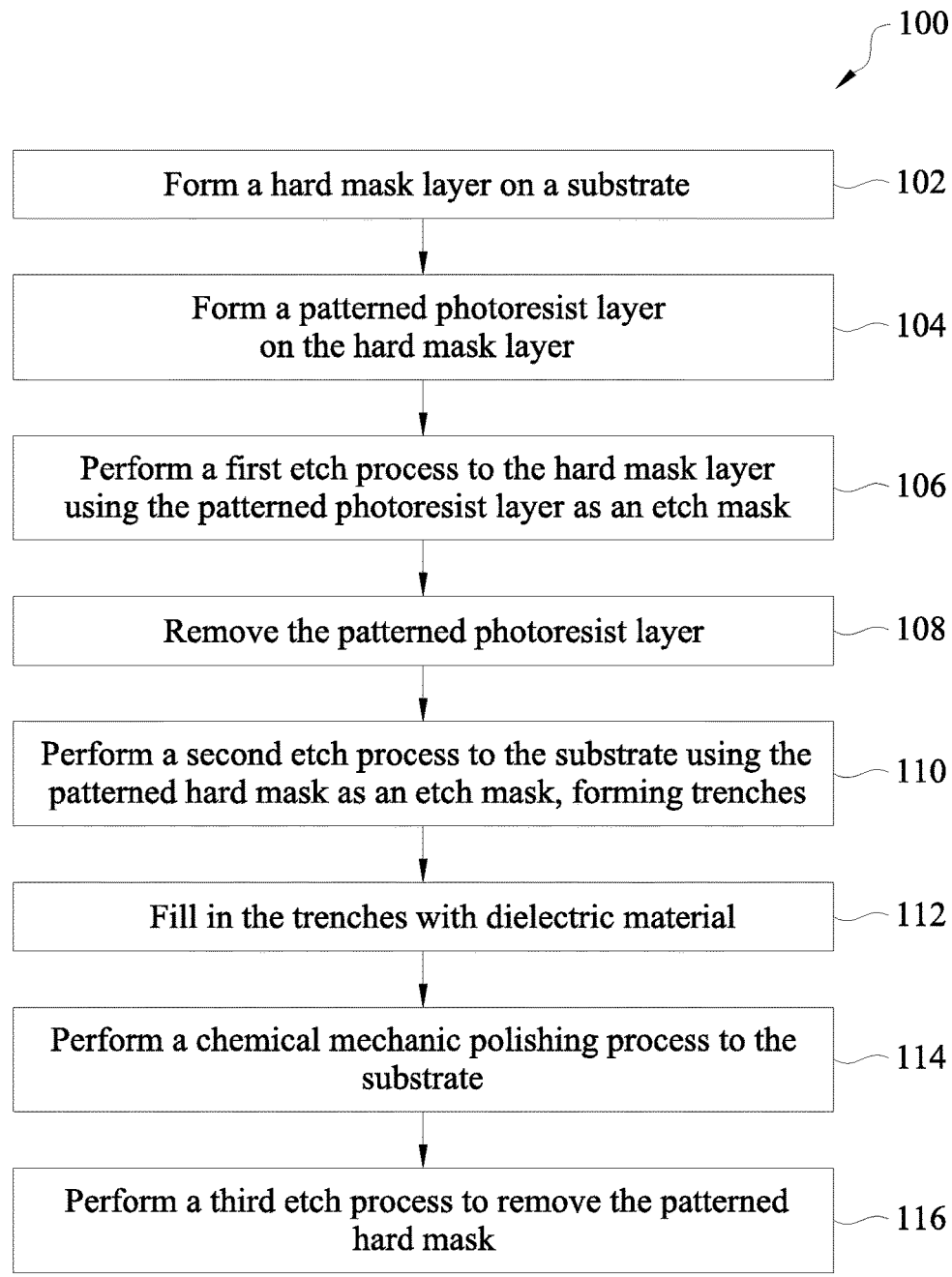
FIG. 1 is a flowchart of a method to make a semiconductor structure constructed according to one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 to make a semiconductor structure constructed according to one embodiment. FIGS. 2-8 are sectional views of a semiconductor structure 200 made by the method 100 at various fabrication stages constructed according to one embodiment. With reference to FIGS. 1 through 8 and other figures, the method 100, the semiconductor structure 200 and the system 200 are collectively described.

Figure 2:
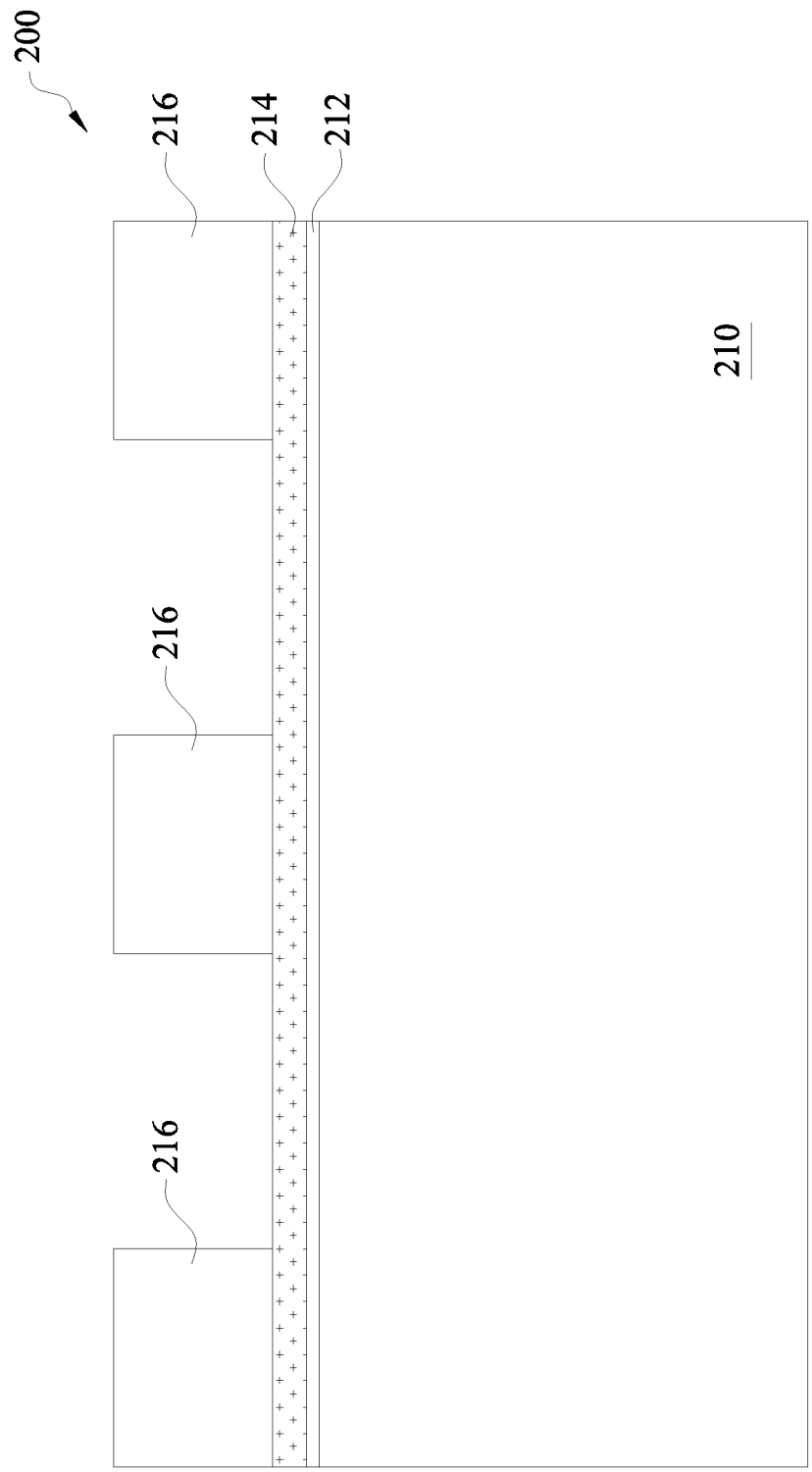
FIGS. 2-8 are sectional views of a semiconductor structure made by the method of FIG. 1 at various fabrication stages constructed according to one embodiment.

Referring to FIG. 2, the semiconductor structure 200 includes a semiconductor substrate 210 of a semiconductor material. In the present embodiment, the semiconductor material is silicon. In furtherance of the embodiment, the semiconductor substrate 210 is a silicon wafer. Alternatively, the semiconductor substrate alternatively or additionally includes another proper semiconductor material, such as silicon germanium, germanium, silicon carbide, garllium arsenic, or other III-V group compound semiconductor material. In another embodiment, the semiconductor substrate 210 includes a buried dielectric material layer for isolation formed by a proper technology, such as a technology referred to as separation by implanted oxygen (SIMOX). In some embodiments, the substrate 210 may be a semiconductor on insulator, such as silicon on insulator (SOI). The semiconductor substrate 210 may also include various doped features, such as n-type wells and p-type wells disposed in respective active regions.

Referring to FIGS. 1 and 2, the method 200 begins at operation 102 by forming a hard mask layer on the substrate 210. In the present embodiment, the hard mask layer includes silicon nitride (SiN) layer 214. In furtherance of the embodiment, the hard mask layer further includes a silicon oxide layer (also referred to as pad oxide) 212 formed on the substrate 210. In this case, the silicon nitride layer 214 is formed on the silicon oxide layer 212. The silicon oxide layer 212 is formed on the substrate 210 by a technique, such as thermal oxidation. The silicon nitride layer 214 is formed on the silicon oxide layer 212 by a deposition technique, such as chemical vapor deposition (CVD), physical vapor deposition (PVD) or other suitable technique.

Still referring to FIGS. 1 and 2, the method 200 proceeds to operation 104 by forming a patterned photoresist layer 216 on the hard mask layer (212 and 214) by a lithography process. In one embodiment, the lithography process includes forming a photoresist layer by spin-on coating; exposing the photoresist layer using an exposure energy, such as ultraviolet (UV) light, and developing the exposed photoresist layer to form the patterned photoresist layer using a developing chemical. In another example, the lithography process includes spin-on coating, soft baking, exposing, post-exposure baking, developing and hard baking. In other embodiment, the lithography process to form the patterned photoresist layer 216 may alternatively use other technique, such as e-beam lithography, maskless patterning or molecular print.

Figure 3:
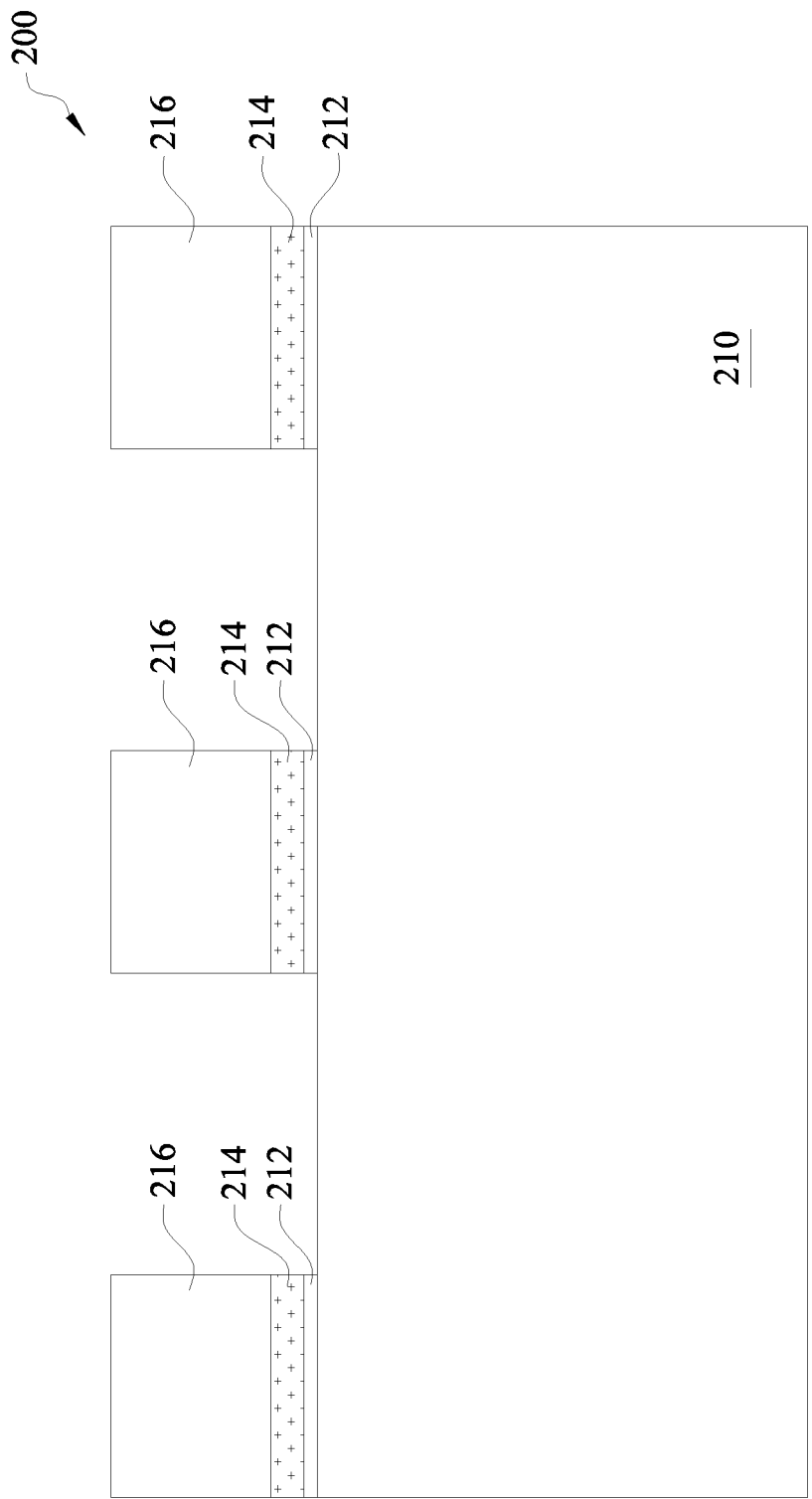

Referring to FIGS. 1 and 3, the method 200 proceeds to operation 106 by performing an etch process to etch the hard mask layer (212 and 214) using the patterned photoresist layer 216 as an etch mask. The etch process is designed to selectively remove the hard mask layer through the openings of the patterned photoresist layer 216, resulting in the patterned hard mask (patterned silicon oxide layer 212 and pattern silicon nitride layer 214). The patterned hard mask has openings such that the substrate 210 is uncovered within the openings. In one example, the tech process includes wet etch with etch solutions designed to selectively etch silicon nitride and silicon oxide. Particularly, the etch process includes two etch steps: a first etch with phosphorous acid solution to etch selectively etch silicon nitride and a second etch with hydrofluoric (HF) solution to etch the silicon oxide. Alternatively, the etch process may include any suitable etch technique, such as dry etch, wet etch, or a combination thereof.

Figure 4:
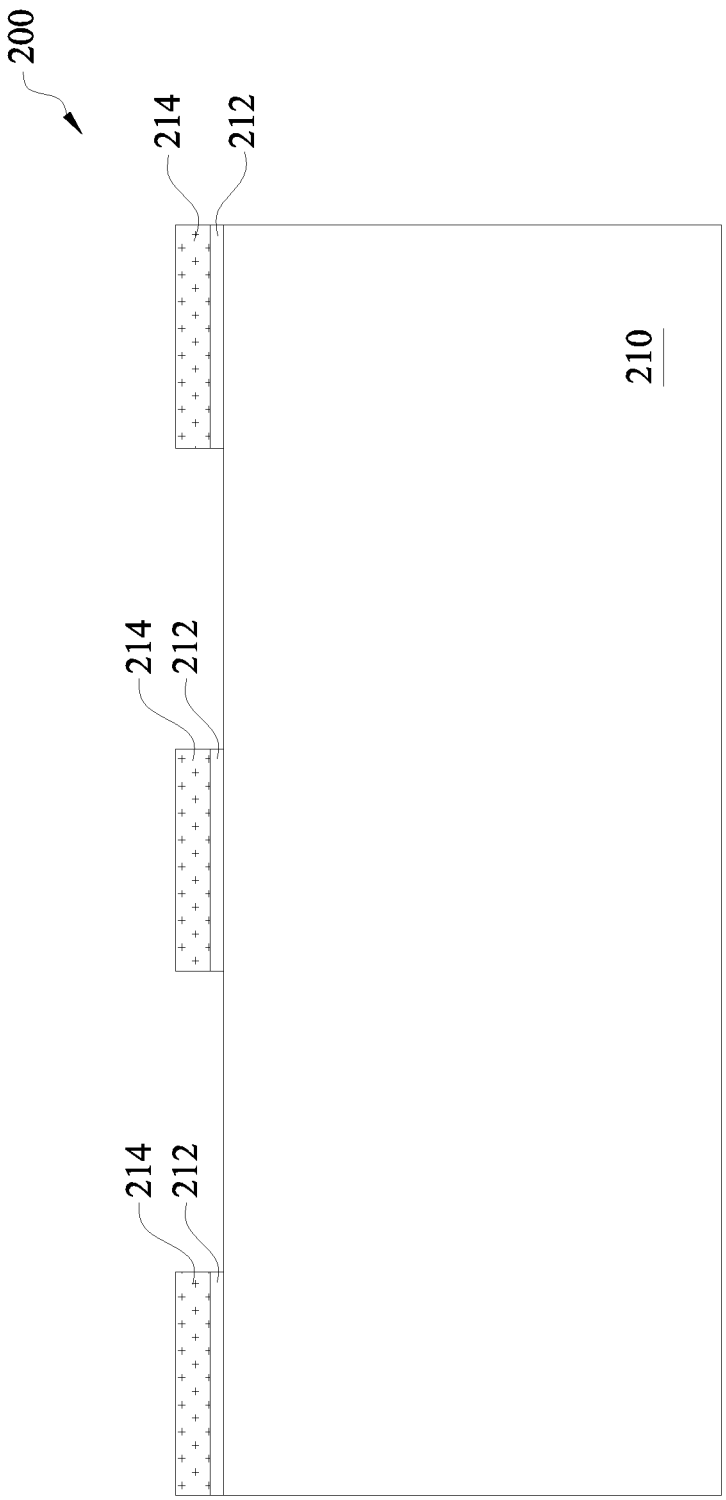

Referring to FIGS. 1 and 4, the method 200 may proceed to operation 108 by removing the patterned photoresist layer 216 using a suitable technique, such as wet stripping or plasma ashing. Alternatively, the removal of the patterned photoresist layer 216 may be executed at a later fabrication stage.

Figure 5:
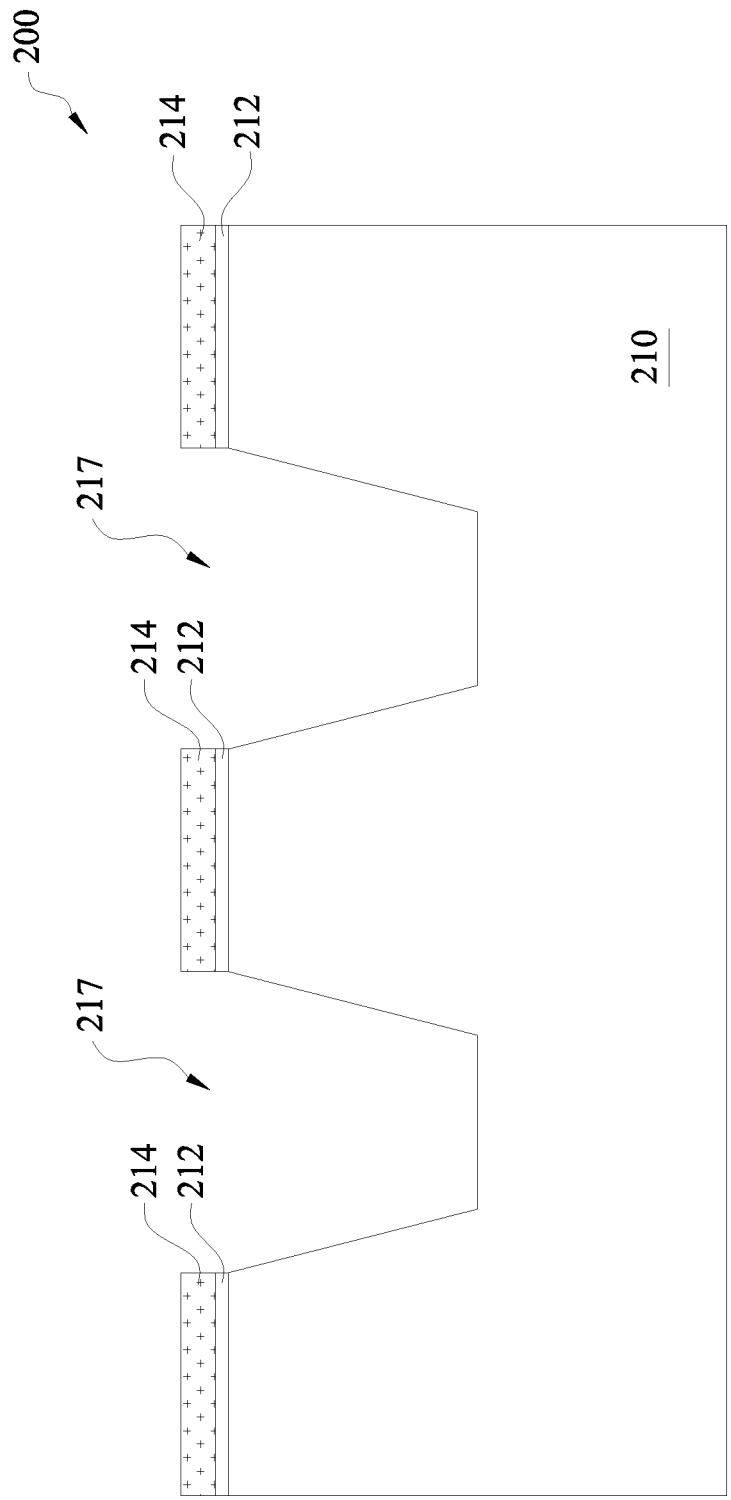

Referring to FIGS. 1 and 5, the method 200 proceeds to operation 110 by performing an etch process to the substrate 210 using the patterned hard mask as an etch mask. Particularly, the etch process is applied to the substrate 210 through the openings of the patterned hard mask. The etch process is designed to selectively etch the substrate 210. In the present embodiment, the etch process selectively etch silicon of the substrate 210 to form trenches 217 in the semiconductor substrate 210.

Figure 6:
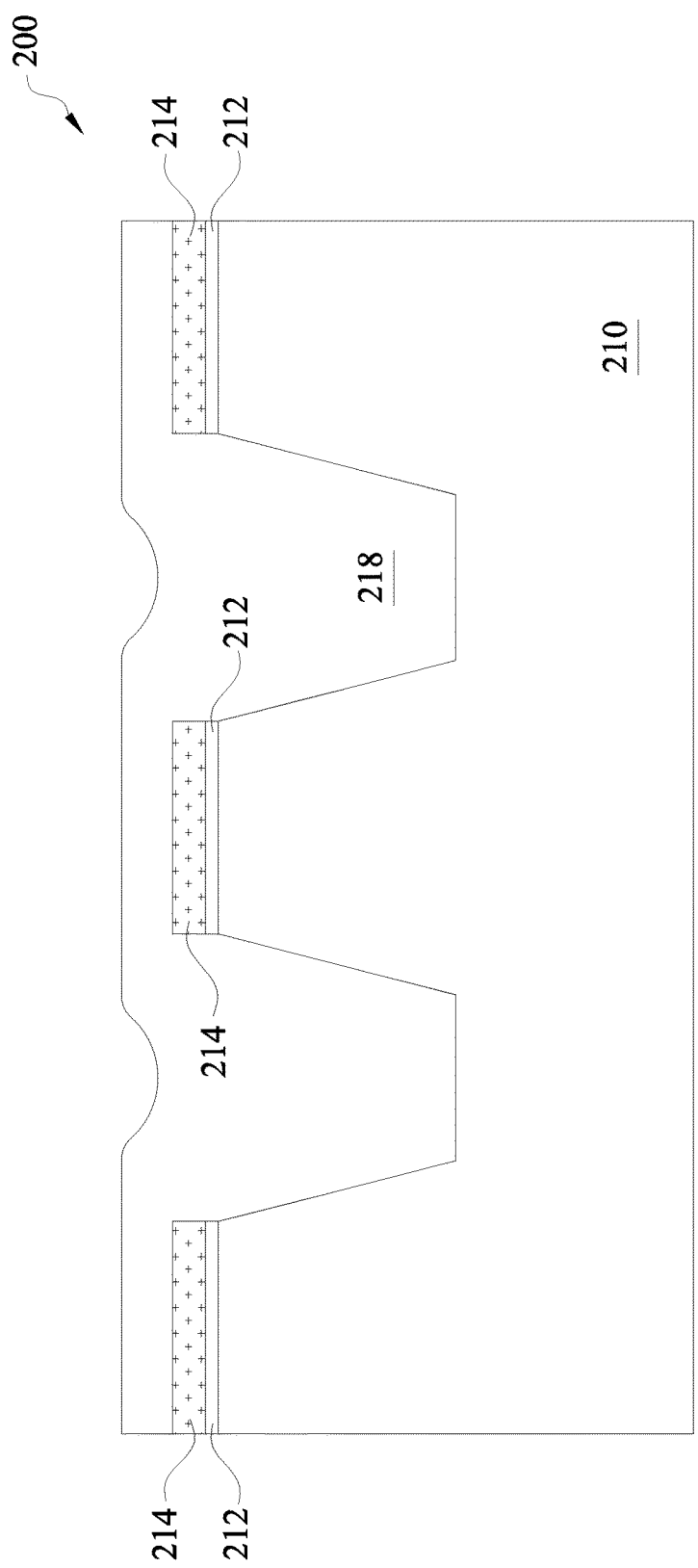

Referring to FIGS. 1 and 6, the method 200 proceeds to operation 112 by filling in the trenches with one or more dielectric material 218. In one embodiment, the dielectric material 218 includes silicon oxide. In another embodiment, the dielectric material 218 includes a lining layer formed on sidewall of the trenches by thermal oxidation and then bulky silicon oxide deposited by CVD, such as high density plasma CVD (HDPCVD). An annealing process may be implemented during the filling the trenches with the dielectric material or implemented thereafter.

Figure 7:
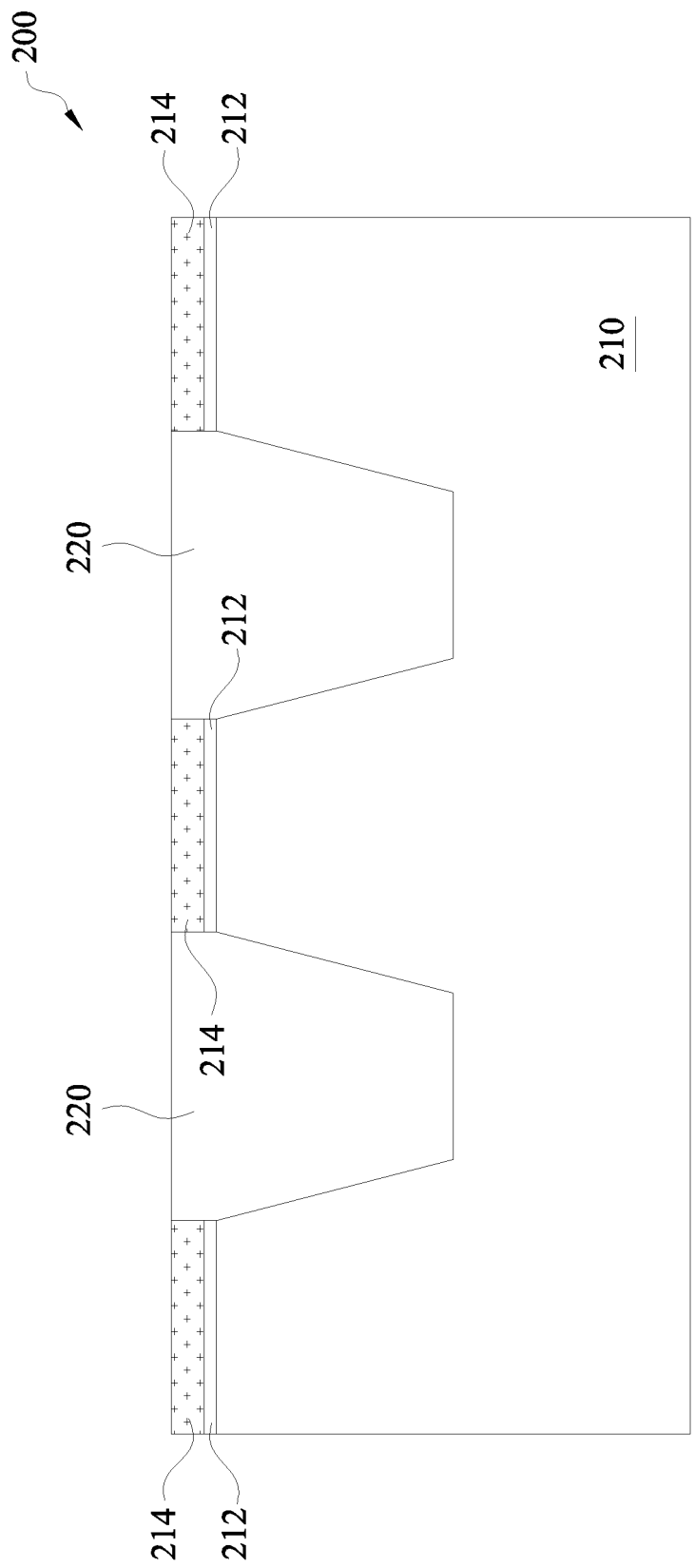

Referring to FIGS. 1 and 7, the method 200 proceeds to operation 114 to perform a chemical mechanical polishing (CMP) process to the substrate 210 to remove the excessive dielectric material 218 deposited on the hard mask and to planarize the top surface of the substrate 210. The CMP process stops on the silicon nitride layer 214. In this case, the silicon nitride layer 214 is used as a polishing stop layer during the CMP process. The STI features 220 are formed as illustrated in FIG. 7.

Figure 8:
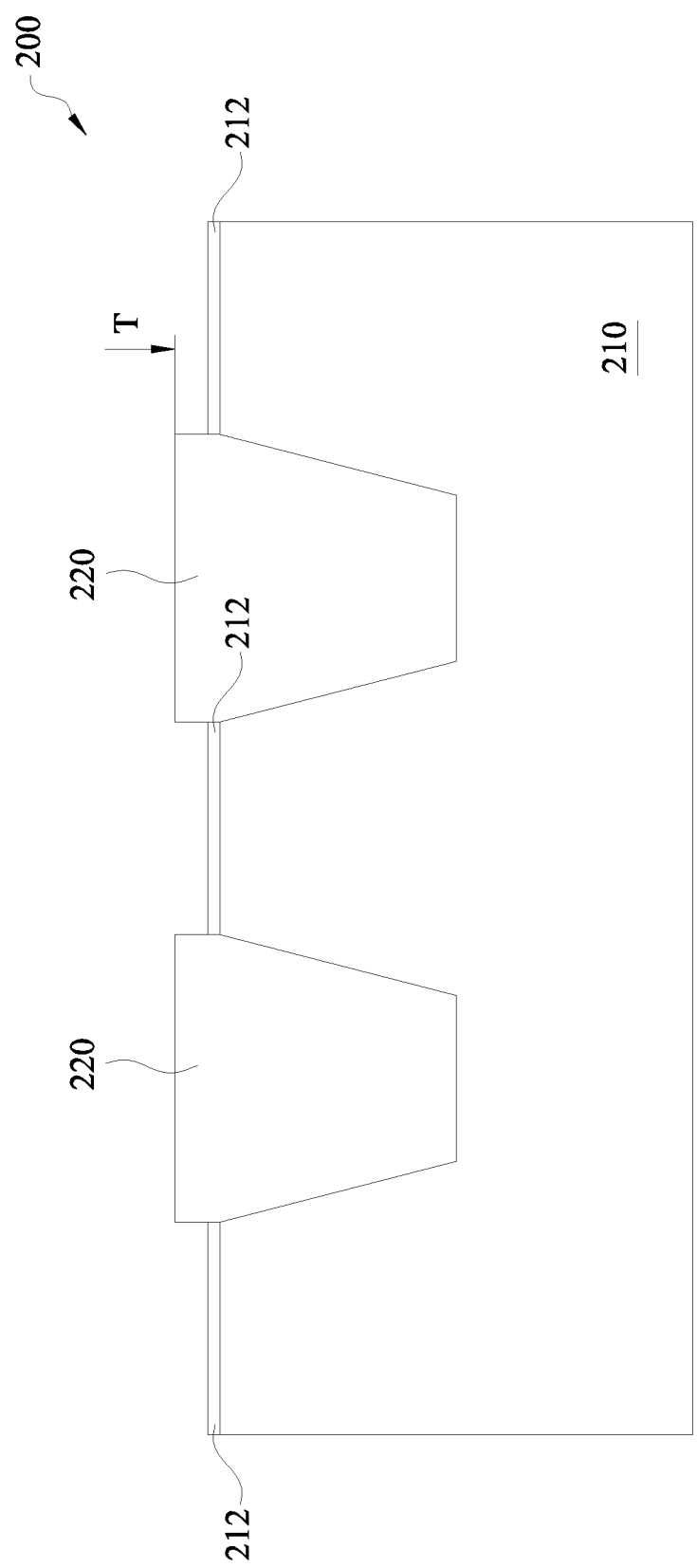

Referring to FIGS. 1 and 8, the method 200 proceeds to operation 116 to remove the silicon nitride layer 214 using a wet etch with an etch solution. In the present embodiment, the etch solution includes phosphorous acid. Particularly, the etch solution includes phosphorous acid ($H_3PO_4$) and water ($H_2O$). Especially, the etch solution is tuned to have a predefined silicon concentration by an etch system and a method, which will be further described later with reference to other FIGS. 10 and 11.

In one embodiment, the method includes measuring the silicon concentration of the etch solution and adjusting the silicon concentration based on the measured silicon concentration. The etch system includes silicon monitor designed and configured to measure the silicon concentration of the etch solution and a module to adjust the silicon concentration of the etch solution.

In another embodiment, the method includes predicting the silicon concentration of the etch solution based on the manufacturing data and adjusting the silicon concentration based on the predicted silicon concentration. By predicting the silicon concentration of the etch solution, the procedure of measuring silicon concentration is eliminated or the number of the measurement is reduced. The prediction of the silicon concentration in the etch solution is achieved by simulating the quantity of the etched silicon nitride based on the manufacturing data. In one example, the predicting is based on a number of wafers etched by the etch solution since the last time the etch solution has been refreshed. In one example, the predicting is based on a number of wafers and further based on the silicon nitride consumption, such as the pattern area of the silicon nitride layer times the etched thickness. The silicon added to the etch solution is determined. Accordingly, the silicon concentration of the etch solution is calculated.

In another embodiment, the method includes a combination of measuring and predicting the silicon concentration of the etch solution. For example, after a number of wafers being etched using the etch solution, the silicon concentration is measured and is adjusted accordingly. Between the measurements, the silicon concentration is predicted based on the manufacturing data and is adjusted accordingly.

In the present embodiment, the etch solution may be heated to a high temperature for optimized etch effect. In one embodiment, the temperature of the etch solution ranges between room temperature and about 200° C. In another example, the etch solution has a concentration of phosphorous acid greater than 0% and less than 99% in volume. After the operation 116, the silicon nitride layer 214 is removed and proper step height "T" is kept for the subsequent process to form other circuit features. The step height "T" is defined as the vertical difference between the top surface of the STI features 220 and the top surface of the silicon oxide layer 212.

Figure 9:
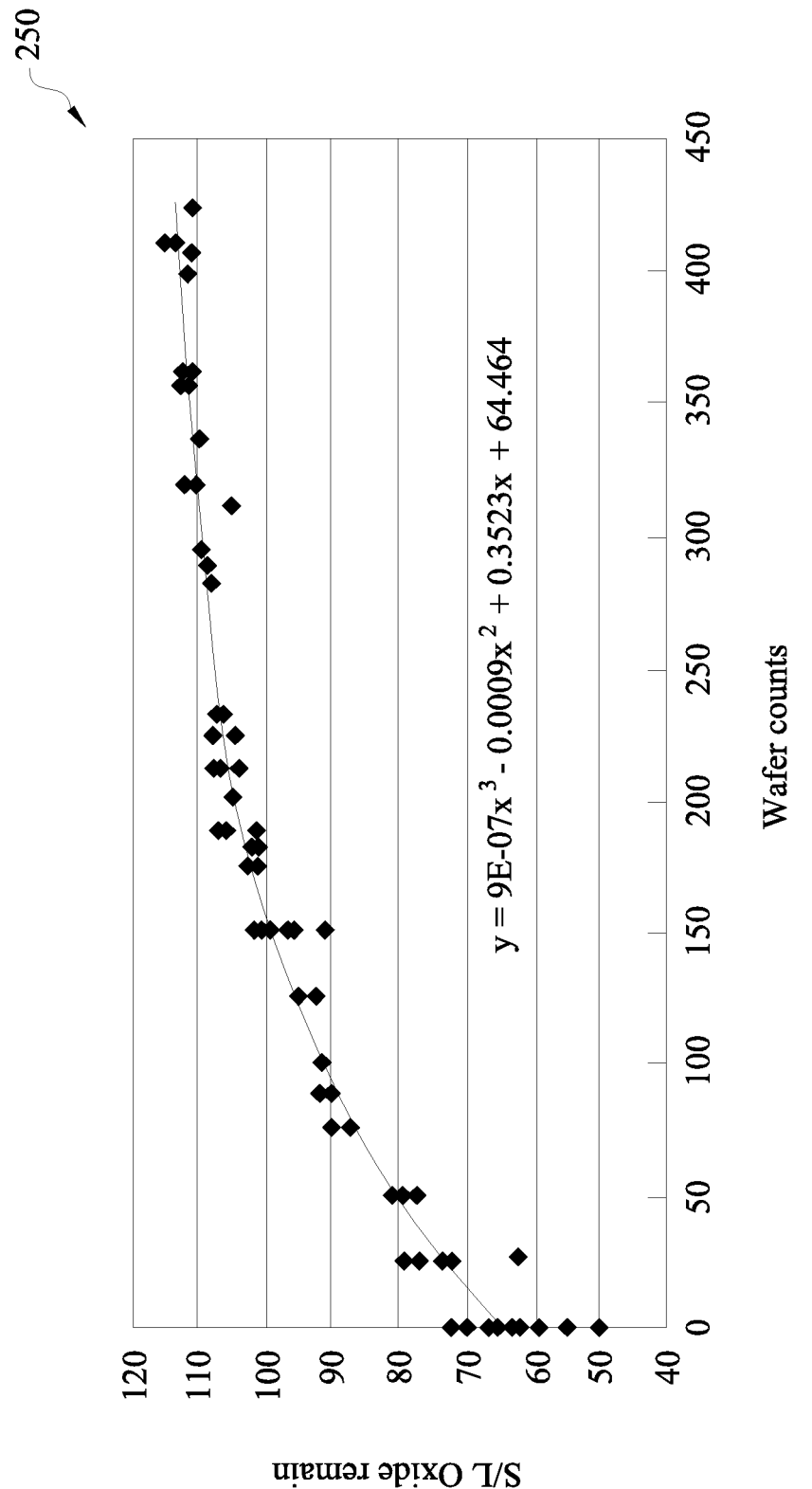
FIG. 9 is a diagram illustrating characteristic data of phosphorous acid etching constructed according to one embodiment.

The etch solution with phosphorous acid can effectively etch silicon nitride but may also etch silicon oxide. One experiment is illustrated in FIG. 9 that shows the pad oxide layer is partially removed during the etch process. In FIG. 9, the horizontal axis represents for a number of wafers being etched by the etch solution and the vertical axis represents the remaining thickness of the pad oxide layer. The experiment demonstrates that the remaining thickness of the pad oxide is related to the number of wafer being etched in the etch solution or is related to the lifetime of the phosphorous acid. State differently, the fresh phosphorous acid has a higher silicon oxide etch rate. It is understood through the experiments and further analysis that the etch rate is related to the silicon concentration in the etch solution. The fresh etch solution has substantially zero silicon concentration. Through the lifetime of the etch solution, more wafers have been etched ad more silicon has been dissolved in the etch solution. Accordingly, the etch rate of the silicon oxide is decreased. Therefore, along with the lifetime of the etch solution, the silicon oxide etch rate is changing and the step height of the STI features changes from wafer to wafer, making the processing condition and device structure unstable from wafer to wafer. According to the above analysis and the discovery, the silicon concentration of the etch solution is dynamically adjusted to a predefined range or a predefined range for the consisting etch resulting and the uniform STI features from wafer to wafer.

Although the method 100 is described according to various embodiments, other operations may present before, during and/or after the operations of the method 100. In one embodiment, after the formation of the STI features, various active regions are defined thereby. Various devices, such as field-effect transistors (FETs) are formed in the active regions.

In another embodiment, fin-like active regions are further formed for fin field effect transistors (FinFETs). After the formation of the STI features, an etch process is applied to the substrate 210 to selectively etch the dielectric material 218 to recess the STI features. In furtherance of the embodiment, the etch process is designed to selectively etch the dielectric material (such as silicon oxide) of the STI features while the semiconductor material (such as silicon) of the substrate 210 remains.

Figure 10:
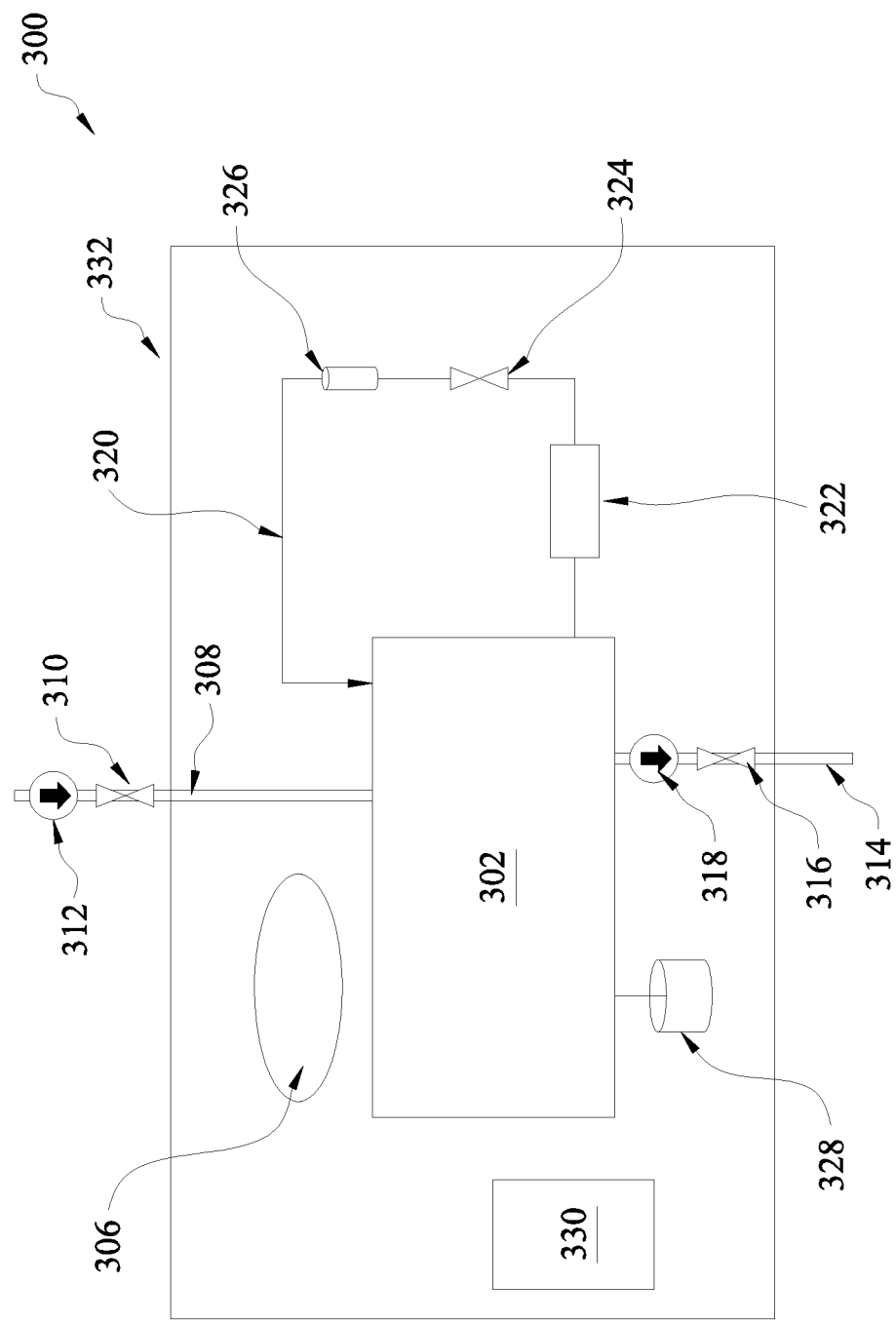
FIG. 10 is a schematic view of an etch system used to implement the method of FIG. 1 constructed according to one embodiment.

The etch system and the method to maintain the etch solution used in the method 100 are further described below. FIG. 10 is a schematic view of an etch system 300 constructed according to one or more embodiment. The etch system 300 includes a container (tank) 302 designed to contain an etch solution for etch. In the present embodiment, the etch solution is phosphorous acid solution. Particularly, the etch solution includes phosphorous acid ($H_3PO_4$) and water ($H_2O$).

Illustrated as an example, a substrate 306, such as a semiconductor wafer, is etched by the etch solution in the container 302. The substrate 306 includes a silicon nitride layer to be etched by the etch solution in the container 302. In one example, the substrate 302 is the semiconductor structure 200.

The etch system 300 includes a chemical supply mechanism 308 coupled with the container 302 and configured to provide fresh etch solution to the container 302. In one embodiment, a flow valve 310 and a flow meter 312 are integrated with the chemical supply mechanism 308 to control and monitor the corresponding chemical flow, respectively.

The etch system 300 includes a chemical drain mechanism 314 coupled with the container 302 and configured to drain the etch solution from the container 302. In one embodiment, a flow valve 316 and a flow meter 318 are integrated with the chemical drain mechanism 314 to control and monitor the corresponding chemical flow, respectively.

In one embodiment, the etch system 300 includes a circulation mechanism 320 coupled with the container 302 and designed to circulate the etch solution for various functions, such as heating and filtering. In one example, a heater 322 is integrated with the circulation mechanism 320 to heat the etch solution such that the etch solution is maintained at a certain temperature for optimized etch effect. In another example, a valve 324 is integrated with the circulation mechanism 320 to control the flow of the etch solution. In other examples, other components 326, such as filter and pump, are integrated with the circulation mechanism 320 to filter out the particles in the etch solution and pump the etch solution for circulation, respectively.

The etch system 300 also includes a silicon monitor 328 configured to monitor the silicon concentration of the etch solution. In one embodiment, the silicon monitor 328 includes an inductive coupled plasma atomic emission spectroscopy (ICP-AES) to measure the silicon concentration of the etch solution.

The etch system 300 further includes a controller 330 coupled the silicon monitor 328 and designed to determine a volume of the etch solution to be replaced based on the silicon concentration from the silicon monitor. The controller 330 includes hardware, software and data storage to calculate the volume based on the measured silicon concentration and a predefined silicon concentration range or a predefined silicon concentration value.

In one embodiment, the controller is further coupled with the drain mechanism 314 and designed to initiate the drain mechanism 314 for draining the etch solution from the container by the determined volume. In another embodiment, the controller is further coupled with the supply mechanism 308 and designed to initiate the supply module for filling the container 302 with fresh etch solution by the determined volume.

The etch system 300 may further include a chamber 332 such that the container 302 is included therein and various etch processes occur inside the chamber 332. The etch system 300 may include other features, modules, and components integrated together to enable the etch processes and to be operable to maintain the silicon concentration of the etch solution.

Figure 11:
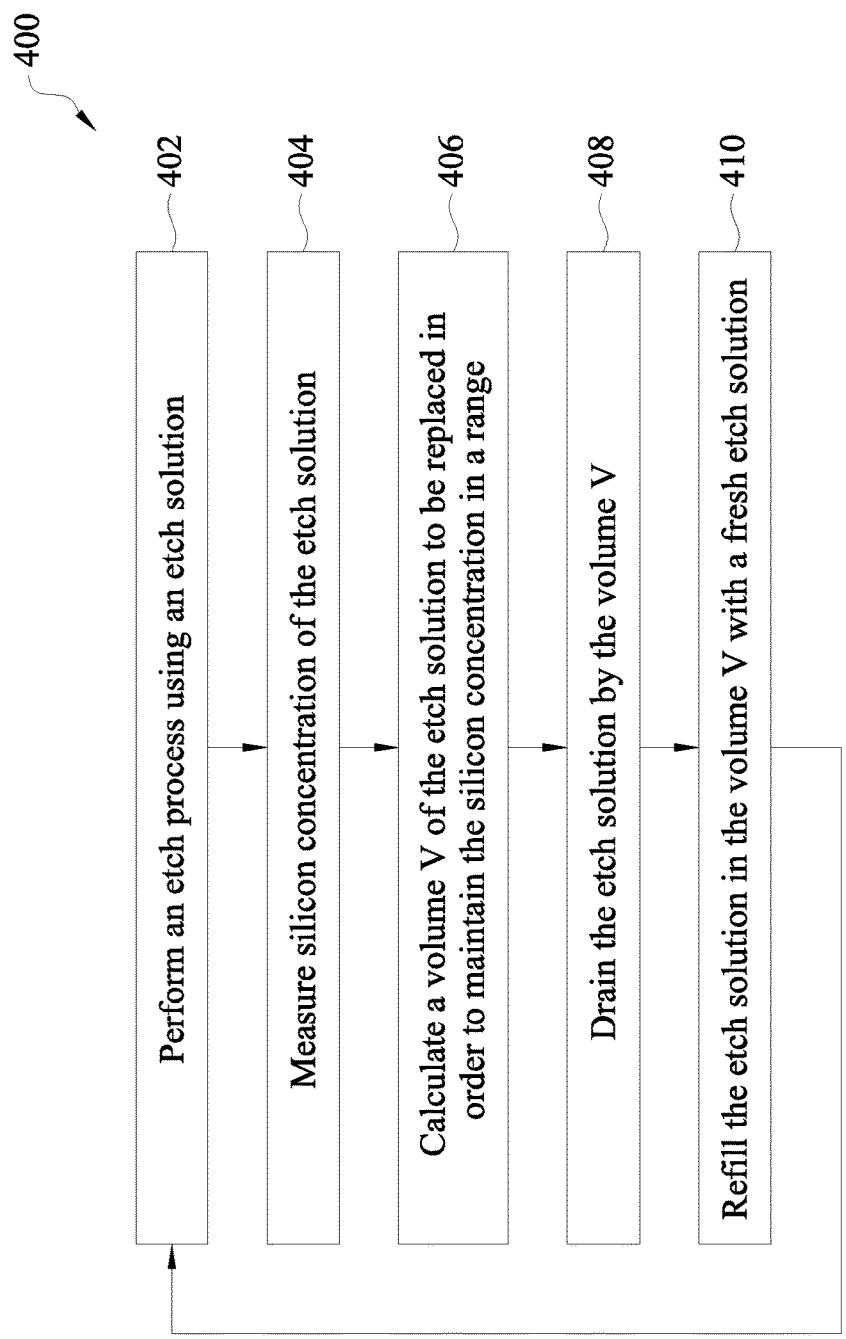
FIG. 11 is a flowchart of a method applied to the etch system of FIG. 10 constructed according to one or more embodiments.

FIG. 11 is a flowchart of a method 400 to implement etch and maintain the silicon concentration of the etch solution. In the present embodiment, the method 400 is implemented in the etch system 300. The method 400 is described with reference to FIGS. 10 and 11. The method 400 begins at an operation 402 by performing an etch process using the etch solution in the container 302. One or more wafer may be etched using the etch solution.

The method 400 includes an operation 404 by measuring the silicon concentration of the etch solution using the silicon monitor 328. In the present embodiment, the silicon concentration is measured by an ICP-AES as the silicon monitor 328.

The method 400 includes an operation 406 by determining the volume of the etch solution to be replaced with the fresh etch solution to maintain the silicon concentration in the predefined range (or value). In one embodiment, the volume $\Delta V$ is determined by a formula as $(V-\Delta V)*C=V*C_0$. The parameter $V$ is a total volume of the etch solution before the draining, $C$ is the measured silicon concentration, and $C_0$ is the predefined silicon concentration.

Through the analysis of various experiments, it is found that that the silicon oxide etch rate is high if the silicon concentration is higher (as noted above). Furthermore, if the silicon concentration of the etch solution is too high, such as close to or beyond the silicon saturation, the silicon will precipitate in the etch solution, introducing particles to the etched wafer(s). Therefore, the predefined silicon concentration C0 is chosen according to those two factors such that it is high enough without significant etch to silicon oxide and low enough (less than the silicon saturation point) without particle concern.

The method 400 includes an operation 408 by draining the etch solution from the container 302 by the determined volume $\Delta V$.

The method 400 also includes an operation 410 by refilling the container 302 with fresh etch solution by the determined volume $\Delta V$ such that the silicon concentration is maintained at the predefined value $C_0$.

The method 400 may proceed to repeat the operations 402 through 410 to perform etch process to a plurality of wafers while the silicon concentration of the etch solution is maintained in the predefined value or within a predefined range.

Various advantages may present in different embodiments of the present disclosure. In one embodiment, the deviation of the silicon oxide etch rate is reduced. Accordingly, the deviation of the STI step height is reduced. Thus, the active regions formed thereby are consistent to wafer to wafer. Thus formed devices (especially devices with small feature size in the advanced technology nodes) have improved device performance. This is because the lower STI step height increases the active region of a small device and causes higher Idsat and the traditional leakage current IDDQ loss.

In another embodiment, since the silicon concentration is kept at a level less than the silicon saturation of the phosphorous acid solution, silicon oxide precipitation defect is eliminated or reduced while a stable etch behavior is maintained. In another embodiment, the chemical lifetime of the etch solution is extended with reduced chemical cost.

Figure 12:
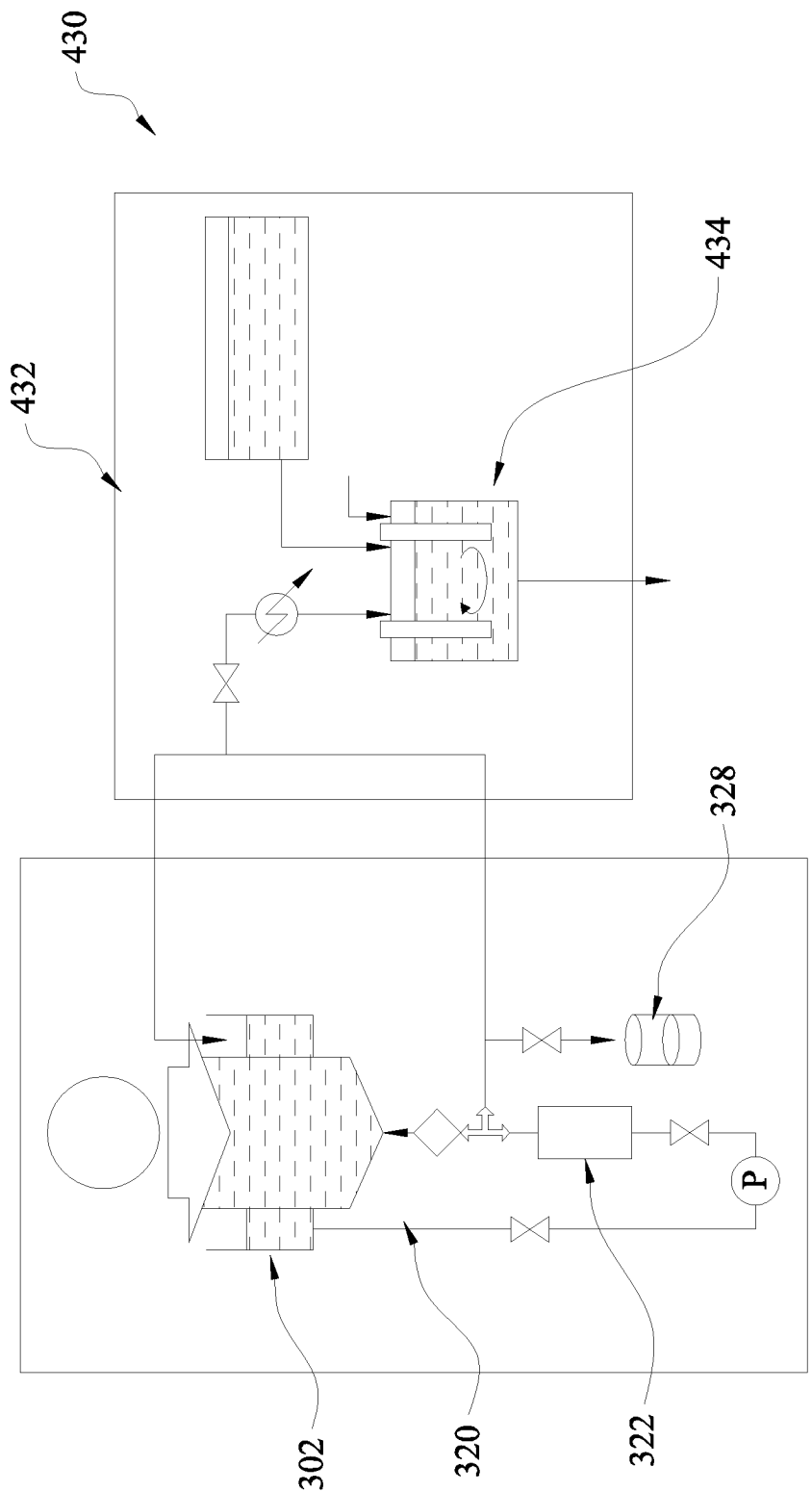
FIG. 12 is a schematic view of an etch system used to implement the method of FIG. 1 constructed according to another embodiment.

FIG. 12 is a schematic view of an etch system 430 constructed according to another embodiment. The etch system 430 is includes a container 302 designed to contain an etch solution for etch. In the present embodiment, the etch solution is phosphorous acid solution. Particularly, the etch solution includes phosphorous acid ($H_3PO_4$) and water ($H_2O$).

The etch system 300 includes a circulation mechanism 320 coupled with the container 302 and designed to circulate the etch solution for various functions, such as heating and filtering. In one example, a heater 322 is integrated with the circulation mechanism 320 to heat the etch solution such that the etch solution is maintained at a certain temperature for optimized etch effect. In another example, other components, such as valve, filter and pump, are integrated with the circulation mechanism 320. Other similar features are illustrated in FIG. 12 and the similar descriptions are not repeated.

The etch system 430 includes a silicon monitor module 432 integrated with the container 302 and designed to monitor the silicon concentration of the etch solution. The silicon monitor module 432 further includes a measurement cell 434. The measurement cell 434, incorporated with other components, is designed to measure the silicon concentration.

Figure 13:
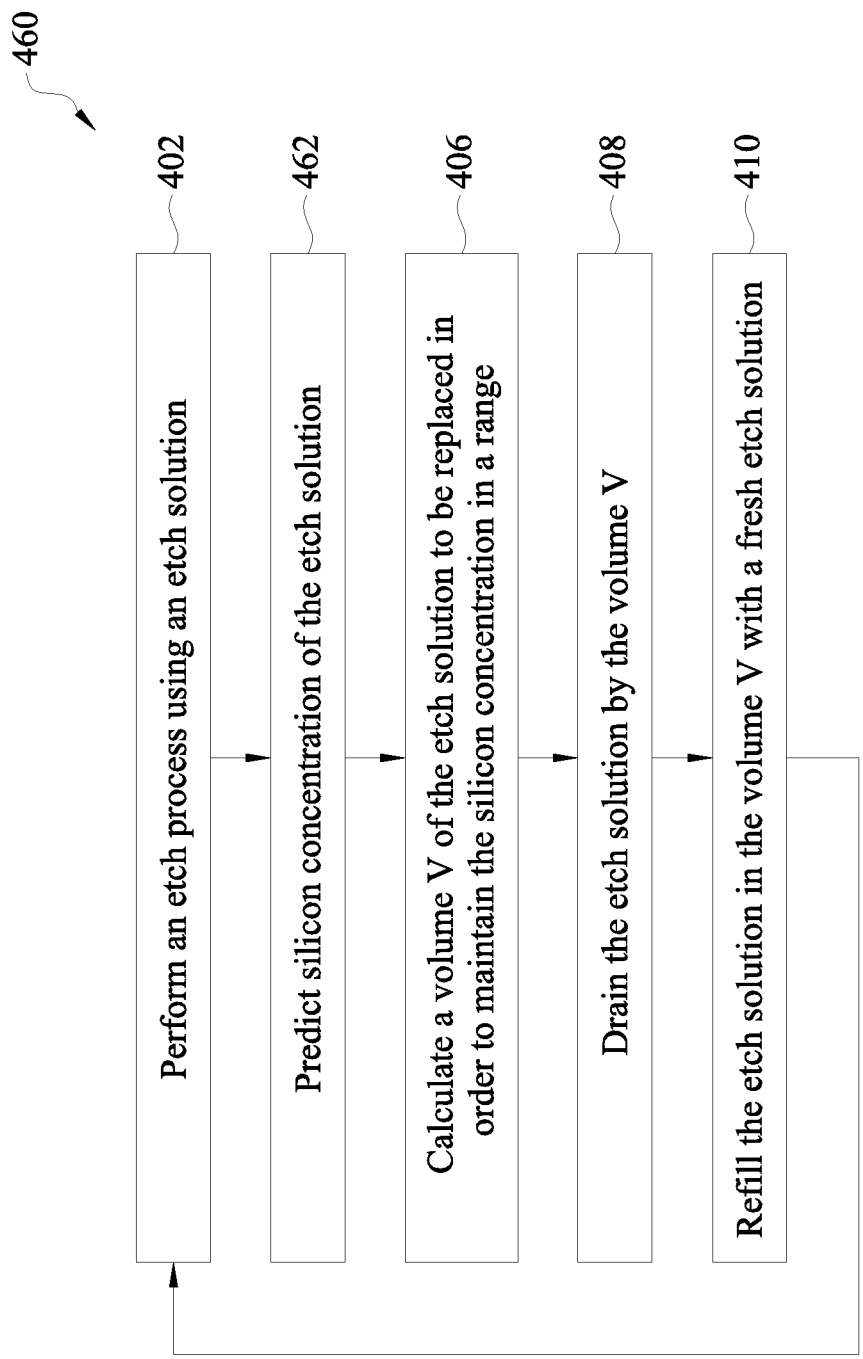
FIG. 13 is a flowchart of a method applied to an etch solution used in the method of FIG. 1 constructed according to one or more embodiments.

FIG. 13 is a flowchart of a method 460 to implement etch and maintain the silicon concentration of the etch solution, constructed according to an alternative embodiment. The method 460 is similar to the method 400 but the silicon concentration is not directly measured by a silicon monitor but is predicted according to manufacturing data, such as the quantity of the etched silicon nitride.

Particularly, the method 460 includes an operation 462 by predicting silicon concentration of the etch solution based on the manufacturing data. The prediction of the silicon concentration in the etch solution is achieved by simulating the quantity of the etched silicon nitride based on the manufacturing data. In one example, the predicting is based on a number of wafers etched by the etch solution since the last time the etch solution has been refreshed. In one example, the predicting is based on a number of wafers and the silicon nitride consumption of each wafer, such as the pattern area of the silicon nitride layer on the wafer times the etched thickness. The silicon added to the etch solution is determined. Accordingly, the silicon concentration of the etch solution is calculated.

In the method 460, the operation 406 is based on the predicted silicon concentration not measured one. Particularly, the operation 406 determines the volume of the etch solution to be replaced with the fresh etch solution to maintain the silicon concentration in the predefined range (or value), based on the predicted silicon concentration. In one embodiment, the volume $\Delta V$ is determined by a formula as $(V-\Delta V)*C=V*C_0$. The parameter V is a total volume of the etch solution before the draining, C is the predicted silicon concentration, and $C_0$ is the predefined silicon concentration.

In another embodiment, the method includes a combination of measuring and predicting the silicon concentration of the etch solution. For example, after a number of wafers being etched using the etch solution, the silicon concentration is measured and is adjusted accordingly. Between the measurements, the silicon concentration is predicted based on the manufacturing data and is adjusted accordingly.

Thus, the present disclosure provides one embodiment of an etch system. The etch system includes a tank designed to hold an etch solution for etching; a silicon monitor configured to measure silicon concentration of the etch solution; a drain module coupled to the tank and being operable to drain the etch solution; and a supply module being operable to fill in the tank with a fresh etch solution.

In one embodiment, the etch system further includes an etch solution controller coupled with the silicon monitor, wherein the etch solution controller is designed to determine a volume of the etch solution to be replaced based on the silicon concentration from the silicon monitor.

In another embodiment, the controller is further coupled with the drain module and initiates the drain module for a draining action of the etch solution from the tank by the volume. In yet another embodiment, the controller is further coupled with the supply module and initiates the supply module for filling the tank with a fresh etch solution by the volume.

In yet another embodiment, the silicon monitor includes an inductively coupled plasma atomic emission spectroscopy (ICP-AES) to measure the silicon concentration of the etch solution. In yet another embodiment, the supply module is coupled with an etch solution source that includes phosphorous acid.

The present disclosure also provides an embodiment of a method that includes performing an etch process using an etch solution; determining a silicon concentration of the etch solution; and adjusting the silicon concentration of the etch solution to a predefined silicon concentration based on the determined silicon concentration.

In one embodiment of the method, the determining a silicon concentration of the etch solution includes measuring the silicon concentration by a silicon monitor. In another embodiment, the determining a silicon concentration of the etch solution includes predicting the silicon concentration based on manufacturing data.

In yet another embodiment, the adjusting the silicon concentration of the etch solution includes draining a volume $\Delta V$ of the etch solution in a container; and filling in the container with the volume $\Delta V$ of fresh etch solution.

In another embodiment, the volume $\Delta V$ is determined based on the measured silicon concentration and the predefined silicon concentration. In furtherance of the embodiment, the volume $\Delta V$ is determined by a formula as $(V-\Delta V)*C=V*C_0$, wherein V is a total volume of the etch solution before the draining; C is the measured silicon concentration; and $C_0$ is the predefined silicon concentration.

In another embodiment, the etch solution includes phosphorous acid; and the performing an etch process includes applying the etch solution to a substrate selectively etch silicon nitride. In another embodiment, the predefined silicon concentration is chosen to be less than silicon saturation concentration.

In yet another embodiment, the predefined silicon concentration is chosen higher enough such that the etch solution selectively etches silicon nitride relative to silicon oxide. In yet another embodiment, the method further includes performing another etch process using the adjusted etch solution.

The present disclosure also provides another embodiment of a method. The method includes forming a silicon nitride layer on a semiconductor substrate; patterning the silicon nitride layer to form an opening therein; etching the semiconductor substrate using the patterned silicon nitride layer as an etch mask, resulting in a trench in the semiconductor substrate; filling in the trench with a dielectric material including silicon oxide; performing a chemical mechanic polishing to the semiconductor substrate; and adjusting silicon concentration of an etch solution including phosphorous acid to a predefined silicon concentration; and removing the patterned silicon nitride layer by the etch solution.

In one embodiment, the adjusting silicon concentration includes measuring silicon concentration of the etch solution; draining a volume $\Delta V$ of the etch solution in a container; and filling in the container with the volume $\Delta V$ of fresh etch solution.

In another embodiment, the volume $\Delta V$ is determined based on the measured silicon concentration and the predefined silicon concentration. In furtherance of the embodiment, the volume $\Delta V$ is determined by a formula as $(V-\Delta V)*C=V*C_0$, wherein V is a total volume of the etch solution before the draining; C is the measured silicon concentration; and $C_0$ is the predefined silicon concentration.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    performing a first etch process on a first wafer to remove a first masking layer using a phosphoric acid ($H_3PO_4$) etch solution, wherein the first wafer includes a first isolation feature having a first step height;
    directly measuring a silicon concentration of the $H_3PO_4$ etch solution after the first etch process on the first wafer;
    predicting the silicon concentration of the $H_3PO_4$ etch solution after the first etch process on the first wafer based on silicon nitride consumption during the first etch process, wherein the silicon nitride consumption is predicted based on a pattern area of a silicon nitride layer and a thickness of the silicon nitride layer;
    adjusting the silicon concentration of the $H_3PO_4$ etch solution to reduce a deviation between the first step height of the first isolation feature and a second step height of a second isolation feature, such that the silicon concentration is set to a predefined silicon concentration based on the directly measured silicon concentration and the predicted silicon concentration, wherein the predefined silicon concentration is less than a silicon saturation concentration of the $H_3PO_4$ etch solution; and
    performing a second etch process on a second wafer to remove a second masking layer using the $H_3PO_4$ etch solution with the adjusted silicon concentration, wherein the second wafer includes the second isolation feature having the second step height.

2. The method of claim 1, wherein the directly measuring the silicon concentration of the $H_3PO_4$ etch solution includes using inductively coupled plasma atomic emission spectroscopy (ICP-AES) to measure the silicon concentration.

3. The method of claim 1, wherein the silicon concentration of the etch solution is further predicted based on manufacturing data.

4. The method of claim 1, wherein the adjusting the silicon concentration of the etch solution includes:
    draining a volume $\Delta V$ of the $H_3PO_4$ etch solution from a container used for performing the etch process; and
    filling the container with the volume $\Delta V$ of fresh $H_3PO_4$ etch solution.

5. The method of claim 4, wherein the volume $\Delta V$ is determined based on the directly measured silicon concentration and the predefined silicon concentration.

6. The method of claim 5, wherein the volume $\Delta V$ is determined by a formula as $(V-\Delta V)*C=V*C_0$, wherein
    V is a total volume of the $H_3PO_4$ etch solution before the draining;
    C is the directly measured silicon concentration after the etch process; and
    $C_0$ is the predefined silicon concentration.

7. The method of claim 1, wherein adjusting the silicon concentration of the $H_3PO_4$ etch solution includes reducing the silicon concentration of the $H_3PO_4$ etch solution.

8. The method of claim 1, wherein the predefined silicon concentration is high enough such that the $H_3PO_4$ etch solution selectively etches silicon nitride relative to silicon oxide.

9. The method of claim 1, further comprising performing another etch process using the adjusted $H_3PO_4$ etch solution.

10. A method, comprising:
    forming an oxide layer over a substrate;
    forming a silicon nitride layer over the oxide layer;
    patterning the silicon nitride layer and the oxide layer to form an opening therein, wherein the patterning includes selectively etching the silicon nitride layer using a phosphorous acid solution and selectively etching the oxide layer using a hydrofluoric solution;
    etching the substrate using the patterned silicon nitride layer and the patterned oxide layer as an etch mask, resulting in a trench in the substrate;
    filling in the trench with a dielectric material;
    performing a chemical mechanic polishing to the substrate, thereby forming an isolation feature, wherein a step height is defined between a top surface of the isolation feature and top surface of the oxide layer;
    directly measuring a silicon concentration of an etch solution including phosphorous acid after processing substrate having isolation features with corresponding step heights;
    adjusting silicon concentration of an etch solution including phosphorous acid to reduce a deviation of the step height of the isolation feature from the corresponding step heights of the isolation features, wherein the adjusted silicon concentration is based on the directly measured silicon concentration, and further wherein the adjusted silicon concentration is less than a silicon saturation concentration of the etch solution; and
    removing the patterned silicon nitride layer with the etch solution having the adjusted silicon concentration.

11. The method of claim 10, wherein the adjusting of the silicon concentration includes:

directly measuring silicon concentration of the etch solution;

draining a volume ΔV of the etch solution in a container; and filling the container with the volume ΔV of fresh etch solution.

12. The method of claim 11, wherein the volume ΔV is determined based on the measured silicon concentration and a predefined silicon concentration.

13. The method of claim 12, wherein the volume ΔV is determined by a formula as $(V-\Delta V)*C=V*C_0$, wherein:

V is a total volume of the etch solution before the draining;

C is the directly measured silicon concentration; and $C_0$ is the predefined silicon concentration.

14. A method, comprising:

providing substrates, wherein a pattered mask layer is disposed over each of the substrates, the patterned mask layer having a patterned silicon oxide layer disposed over the substrate and a patterned silicon nitride layer disposed over the silicon oxide layer;

applying a phosphoric acid ($H_3PO_4$) and water ($H_2O$) etch solution to the substrates to remove the patterned silicon nitride layers from the substrates while minimally removing the patterned silicon oxide layers; and wherein the applying of the etch solution includes:

directly measuring a silicon concentration of the etch solution before applying the etch solution to the substrates, based on the directly measured silicon concentration, reducing the silicon concentration of the etch solution to a silicon concentration that achieves reduces deviation in an oxide etch rate when removing the patterned silicon nitride layers, such that the substrates include isolation features having step heights with reduced deviation, wherein the reduced silicon concentration is less than a silicon saturation concentration of the etch solution, for each of the substrates, predicting the silicon concentration of the etch solution based on a number of the substrates etch by the etch solution since the silicon concentration of the etch solution has been reduced based on the directly measured silicon concentration, and for each of the substrates, adjusting the silicon concentration based on the predicted silicon concentration before applying the etch solution.

15. The method of claim 14, wherein the silicon concentration of the etch solution is further adjusted based on a simulated quantity of silicon nitride to be etched by the etch solution.

16. The method of claim 14, wherein the predicting of the silicon concentration of the etch solution is further based on silicon nitride consumption by the patterned silicon nitride layer of the substrates, wherein the silicon nitride consumption is based on a pattern area of the patterned silicon nitride layer and a thickness of the silicon nitride layer.

17. The method of claim 14, wherein each of the substrates is a semiconductor wafer.

* * * * *